United States Patent
Roohparvar

(10) Patent No.: US 7,069,377 B2
(45) Date of Patent: Jun. 27, 2006

(54) SCRATCH CONTROL MEMORY ARRAY IN A FLASH MEMORY DEVICE

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 10/431,766

(22) Filed: May 8, 2003

(65) Prior Publication Data

US 2004/0225825 A1    Nov. 11, 2004

(51) Int. Cl.
G06F 12/00    (2006.01)
G11C 11/34    (2006.01)

(52) U.S. Cl. .................... 711/103; 711/718; 365/185; 365/189

(58) Field of Classification Search ............... None
See application file for complete search history.

(56) References Cited

U.S. PATENT DOCUMENTS

| 5,539,699 | A | 7/1996 | Sato et al. |
| 5,867,430 | A * | 2/1999 | Chen et al. ............ 365/189.04 |
| 6,041,001 | A | 3/2000 | Estakhri |
| 6,477,672 | B1 | 11/2002 | Satoh |
| 6,747,894 | B1 * | 6/2004 | Kawamura ............ 365/185.03 |
| 2004/0049628 | A1 * | 3/2004 | Lin et al. .................... 711/103 |
| 2004/0128594 | A1 * | 7/2004 | Elmhurst et al. ........... 714/718 |

* cited by examiner

*Primary Examiner*—Mano Padmanabhan
*Assistant Examiner*—Duc T Doan
(74) *Attorney, Agent, or Firm*—Leffert Jay & Polglaze, PA

(57) ABSTRACT

A memory device has a scratch control array of non-volatile memory cells that is separate from the primary array of memory cells. The scratch control array stores an instruction sequence for execution by the memory device's controller circuit. The sequence can include instructions for testing of the memory device. The execution of the instruction sequence is initiated and the control circuit fetches each instruction from the scratch control array for execution. The results are then reported and/or stored in the scratch control array.

23 Claims, 6 Drawing Sheets

SCRATCH CONTROL MEMORY ARRAY IN A FLASH MEMORY DEVICE

TECHNICAL FIELD OF THE INVENTION

The present invention relates generally to memory devices and in particular the present invention relates to testing of memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

Flash memory devices typically have controller circuits that are responsible for executing operations of the memory device. For example, the controller may execute instructions for erasing or programming the memory cells. An increase in the complexity of the flash memory devices has created a need for more complex controller circuits on the device.

Some flash memory devices use a microsequencer as the controller circuit. This is an internal state machine that steps through a sequence of operations to achieve a certain goal. The microsequencers rely on hard coded sequences for the different operations of the flash memory device.

Typical flash memory uses a single bit-per-cell. Each cell is characterized by a specific threshold voltage or $V_t$ level. Electrical charge is stored on the floating gate of each cell. Within each cell, two possible voltage levels exist. These two levels are controlled by the amount of charge that is programmed or stored on the floating gate; if the amount of charge on the floating gate is above a certain reference level, the cell is considered to be in a different state (e.g., programmed, erased).

Multilevel cells have recently been introduced to greatly increase the density of a flash memory device. This technology enables storage of multiple bits per memory cell by charging the floating gate of the transistor to different levels. This technology takes advantage of the analog nature of a traditional flash cell by assigning a bit pattern to a specific voltage range. This technology permits the storage of two or more bits per cell, depending on the quantity of voltage ranges stored on the cell.

With the introduction of multilevel cells, the precision at which the voltages on the device are sensed must greatly increase. This increases the complexity of testing the memory devices. For example, the analog voltages used on the devices must be set on a die-by-die basis due to minute differences in the die composition. This greatly increases test time and test cost.

For the reasons stated above, and for other reasons stated below which will become apparent to those skilled in the art upon reading and understanding the present specification, there is a need in the art for a more flexible method of testing memory devices.

SUMMARY

The above-mentioned problems with memory testing and other problems are addressed by the present invention and will be understood by reading and studying the following specification.

The various embodiments relate to a flash memory device that has a controller circuit for executing instructions and generating control signals. The memory device further has at least one array block of non-volatile memory and a scratch control array of non-volatile memory cells that is separate from the at least one array block of non-volatile memory. The scratch control array stores the instructions that are executed by the controller circuit.

Further embodiments of the invention include methods and apparatus of varying scope.

DETAILED DESCRIPTION

Figure 1:
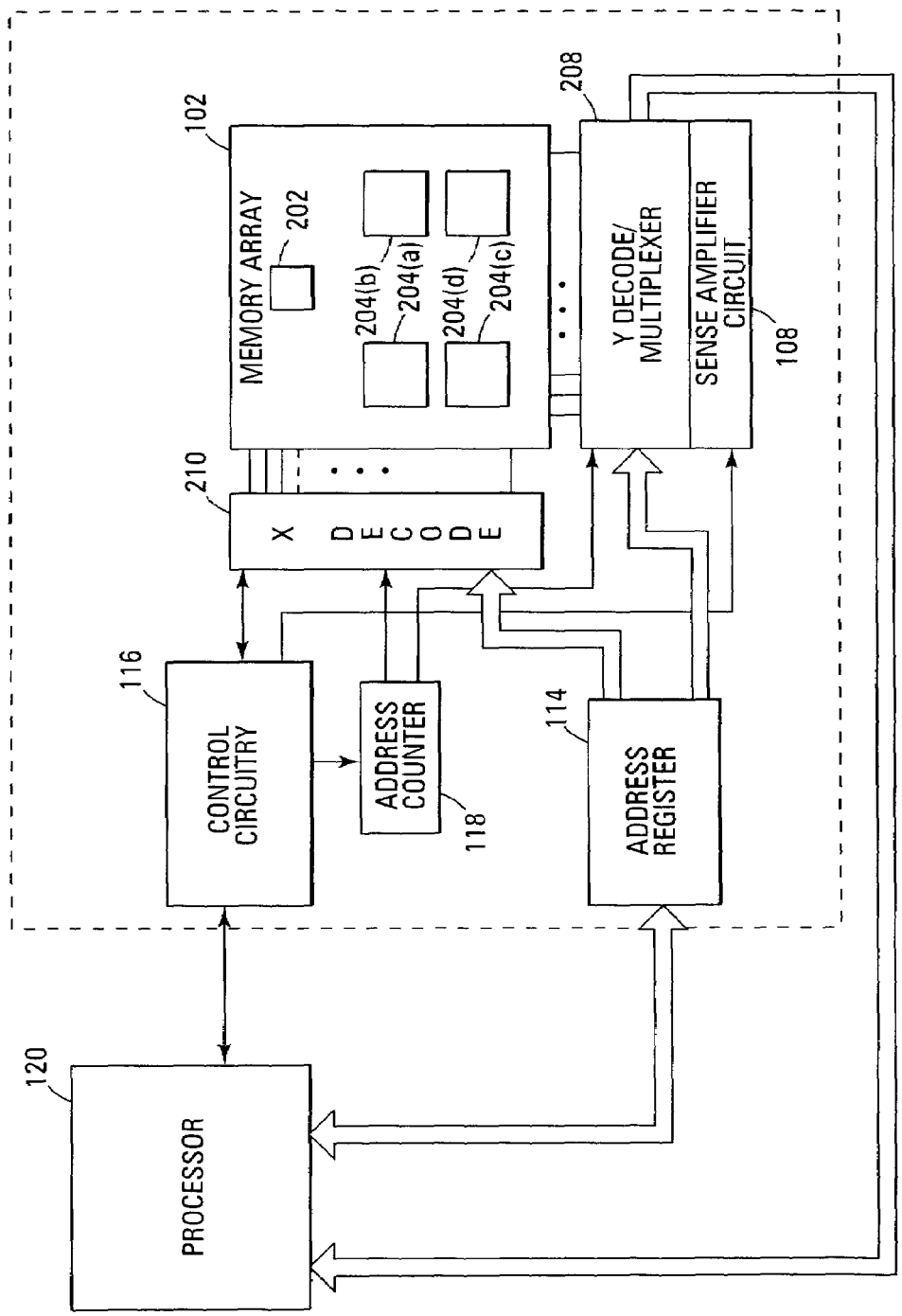
FIG. 1 is a block diagram of one embodiment of a memory system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified block diagram of a memory system incorporating one embodiment of a flash memory 100 of the present invention having a scratch control memory array. As shown, the flash memory 100 has control circuitry 116 to control memory operations to a memory array 102. These memory operations may include reading, writing and erasing. In one embodiment, the control circuitry 116 is a microsequencer 116.

The microsequencer 116 may go through a series of steps that select a word line in the memory array, apply a controlled voltage for a given duration of time, clean the residual voltages off the bit lines, verify whether the cell has been programmed to a satisfactory level, and repeat those steps until the desired operation is complete. The microsequencer 116 can perform other tasks depending on the embodiment.

The flash memory is also shown having an address register 114, an address counter 118, an X decode circuit 210, a Y decode circuit/multiplexer circuit 208 and a sense amplifier circuit 108. The X decode circuit 210 decodes address requests to rows of memory cells in the memory array 102. Although not shown, the X decode circuit 210 may include a multiplexer circuit to combine two or more signals. The Y decode/multiplexer circuit 208 decodes and multiplexes address requests to columns of memory cells in the memory array 102. The sense amplifier circuit 108 reads addressed or accessed memory cells in the memory array 102.

The memory array 102 has four array blocks 204(*a–d*) of memory cells that may be referred to as the primary array 204(*a–d*). The memory array 102 is also shown as having a "scratch control memory array" 202. The scratch control memory array is coupled to the memory array 102 so as to use the same peripheral circuitry as the array blocks 204 (*a–d*). The memory array 102 is discussed subsequently in greater detail with reference to FIG. 2.

The scratch control memory array 202 stores the steps of the microcode that are executed by the microsequencer 116. The users testing the memory device can store different algorithms in this array 202 for a memory device test that has to be performed on a part-by-part basis. One embodiment may require extra circuitry to execute the test steps, depending on the desired results. Once the test steps have been stored, its execution by the microsequencer is initiated, the steps are retrieved from the scratch control memory array 202, and the microsequencer can then report back the results of the test steps. Therefore, the scratch control memory array 202 of the present invention allows parallel testing of memory devices, thereby increasing testing throughput and reducing costs.

Although, FIG. 1 is illustrated as having a primary array with four erasable array blocks 204(*a–c*) of memory, it is understood in the art that the present invention is not limited to any certain quantity of erasable blocks.

An external processor 120 is coupled to the control circuitry 116 to provide external commands to the flash memory 100. The processor 120 is also coupled to the address register 114 to provide address requests. The processor 120 of the system of the present invention is any microprocessor, microcontroller, or other type of control circuitry.

The flash memory device illustrated in FIG. 1 has been simplified to facilitate a basic understanding of the features of the memory of the present invention. A more detailed understanding of internal circuitry and functions of flash memories are known to those skilled in the art.

Figure 2:
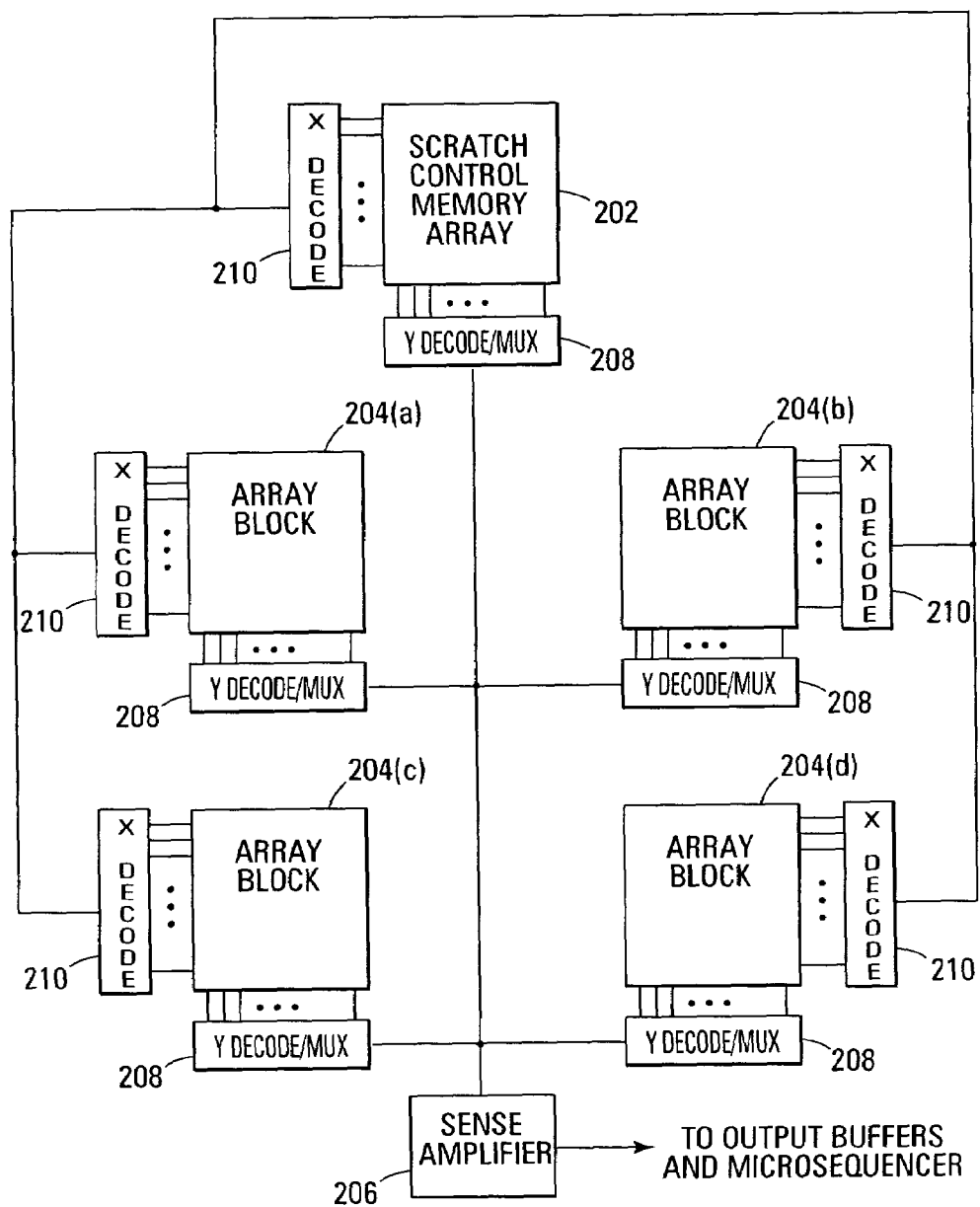
FIG. 2 is a block diagram of one embodiment of the memory array incorporating the scratch control memory array of the present invention.

FIG. 2 illustrates a block diagram of one embodiment of the memory array 102 incorporating the scratch control memory array 202 and support circuitry 208 and 210 of the present invention. The array blocks 204(*a–d*) are coupled to the X decode 210 and the Y decode/multiplexer 208. The scratch control memory array 202 is also coupled to the X decode 210 and the Y decode/multiplexer 208. This limits the amount of added elements needed to store and implement the operating parameters.

The sense amplifier 206 reads the state of the addressed cells in the array blocks 204(*a–d*) as well as the memory cells of the scratch control memory array 202. As illustrated in FIG. 2, an output of sense amplifier 206 is selectively coupled to the output buffers of the memory device as is well know in the art. The output of the sense amplifier 206 is also coupled to the microsequencer or other control circuit so that the instructions stored in the scratch control memory array 202 can be accessed and executed.

An advantage of using a sense amplifier 206, as described, is that it creates a very reliable system. In addition, since the scratch control memory array 202 is coupled as a normal memory block, the memory is able to use an internal algorithm of the control circuitry 116 to verify if an operating parameter was successfully written to an associated local latch.

Figure 3:
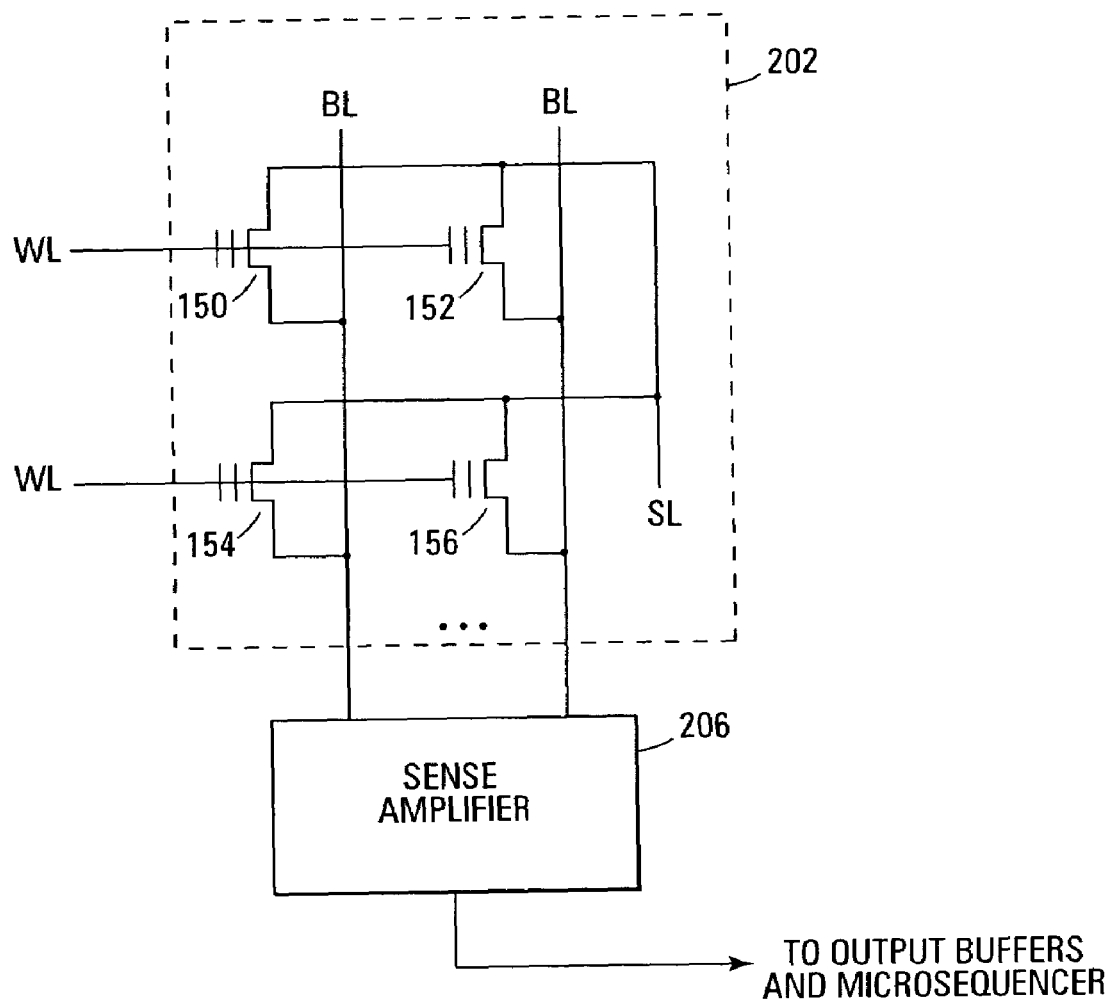
FIG. 3 is a block diagram of one embodiment of the memory cells of the scratch control memory array of the present invention.

Two common types of Flash memory array architectures are the "NAND" and "NOR" architectures. FIG. 3 illustrates individual memory cells 150, 152, 154 and 156 of the scratch control memory array 202, in the NOR architecture, as they are coupled to a sense amplifier 206.

Word lines WL are coupled to control gates of the memory cells 150, 152, 154 and 156 to selectively activate the memory cells 150, 152, 154 and 156. A source line SL is also coupled to memory cells 150, 152, 154 and 156. In addition, each memory cell 150, 152, 154 and 156 is coupled to sense amplifier 206 with a respective bit line BL. The sense amplifier 206 may be a current sense amplifier or a voltage sense amplifier. The operation of the word, bit, and source lines are well known in the art and are not discussed further.

The memory cell configuration of FIG. 3 is for purposes of illustration only. The present invention is not limited to any one memory architecture.

For purposes of clarity, FIG. 3 shows only four non-volatile memory cells 150, 152, 154 and 156. However, the scratch control memory array 202 is comprised of as many memory cells as required to store the microsequencer instructions of the present invention.

Figure 4:
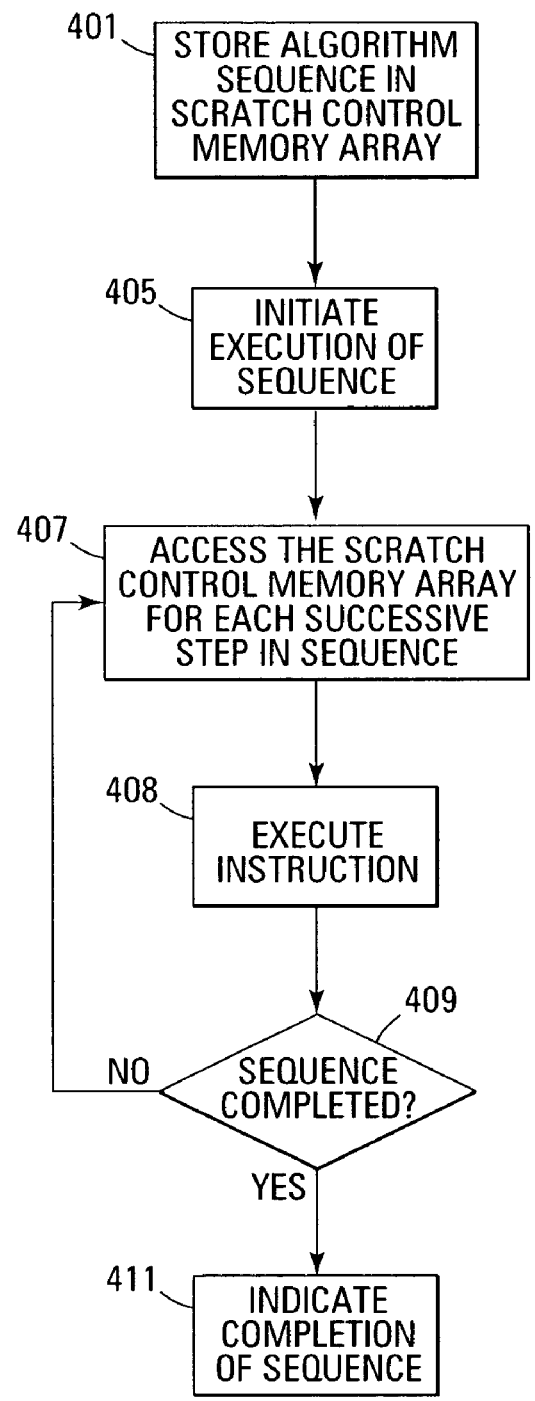
FIG. 4 is a flowchart of one embodiment for using the scratch control memory of the present invention.

FIG. 4 illustrates a flowchart of one embodiment for using the scratch control memory array of the present invention. The steps of the test algorithm sequence are stored in the scratch control memory array 401. The test sequence may be a reliability test for the memory device, a stress function for the memory cells of the memory array, or any other type of instruction sequence that can be stored in the scratch control memory. The present invention is not limited to any one instruction sequence.

The test sequence is then executed in response to an initiation command 405. The initiation, in one embodiment, comes from a test technician or other person involved in the manufacturing/development process. In another embodiment, the sequence for the test algorithm is initiated automatically upon some condition of the memory device being true. For example, if a predetermined number of cells of the primary memory array are flagged as bad, the test sequence steps stored in the scratch control memory are initiated when the quantity of bad cells crosses a predetermined threshold of bad cells. The test sequence can then be used to perform a diagnostics test on the primary array. The present invention is not limited to any one type of test sequence initiation.

Once initiated, the microsequencer or other controller circuit accesses the scratch control memory for each instruction to be performed 407. The retrieved instruction is then executed as required 408.

Each instruction is checked to determine if the end of the sequence of test instructions has been reached 409. This may be accomplished by an end of sequence command, a non-operational command, or some other type of flag to indicate the end of the test sequence.

If the test sequence has not ended, the method returns to retrieving the next sequence step in the method 407. If the test sequence has ended, an indication is given to indicate an end to the test sequence 411. This indication may be a report on the results of the test sequence that is stored in the scratch control memory array (e.g., quantity of failed cells). Other indications include a successful completion indication, a failed test indication, or any other type of end of test indication.

In an alternate embodiment, the test sequence can be updated by the test technician. This update may be done in response to the results of the initial execution of the test sequence.

Figure 5:
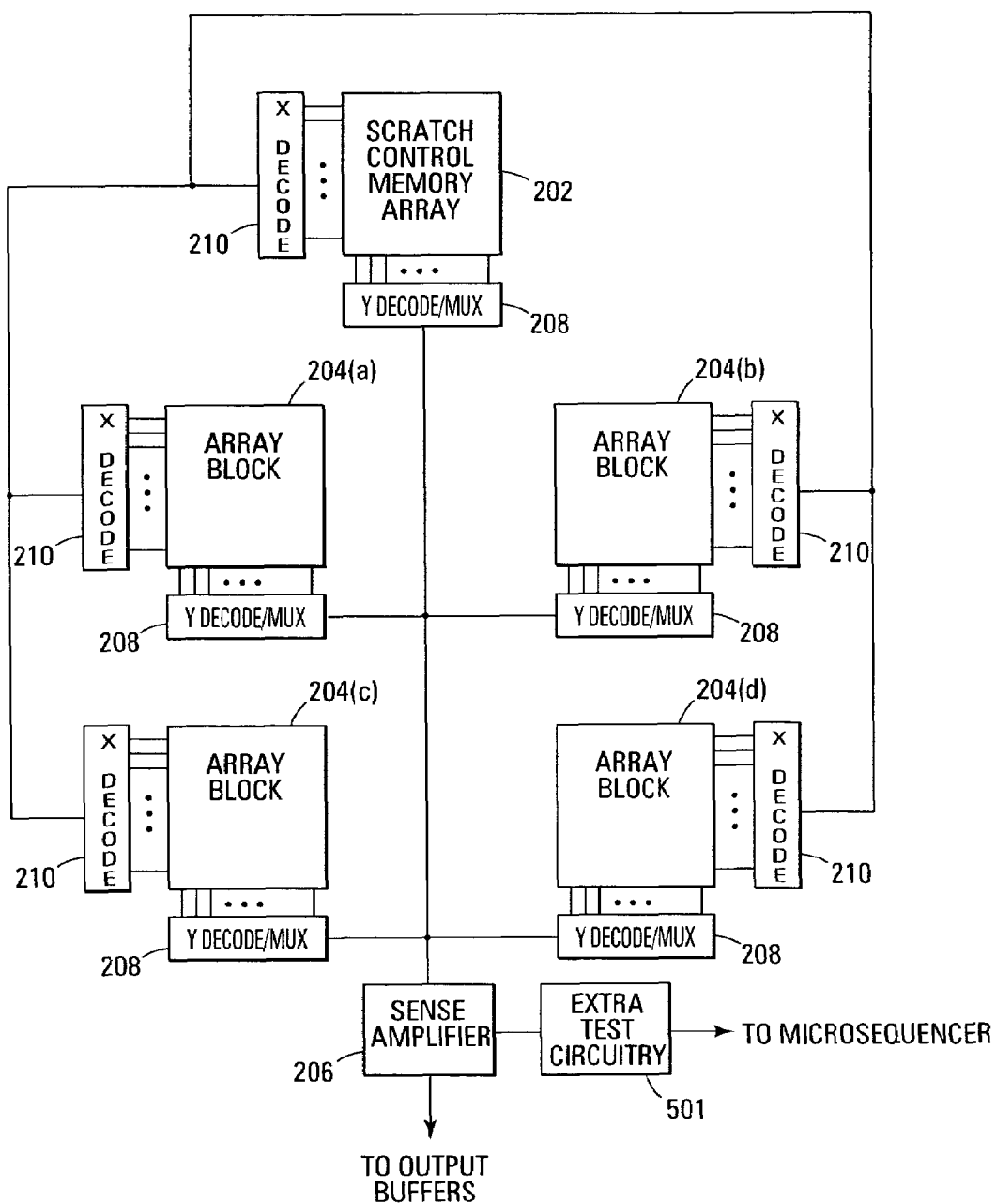
FIG. 5 shows a block diagram of an alternate embodiment of the scratch control memory array of the present invention.

FIG. 5 illustrates an alternate embodiment of the scratch control memory array of the present invention. This embodiment includes extra test circuitry 501 that is used in conjunction with the test sequence that is stored in the scratch control memory array 202. This test circuitry 501 may be necessary if the test sequence requires a test function that is not normally present in a flash memory device.

In one embodiment, the flash memory device implements multi-level cells that are capable of storing two or more logic levels per cell. This requires a very precise and flexible scheme to determine the various voltage ranges in the cell. The extra test circuitry 501 can be used in conjunction with the microsequencer or other controller circuitry to test the presence and accuracy of the multiple ranges. The present invention is not limited to any one use for the extra circuitry that is used by the test sequence/algorithm.

Figure 6:
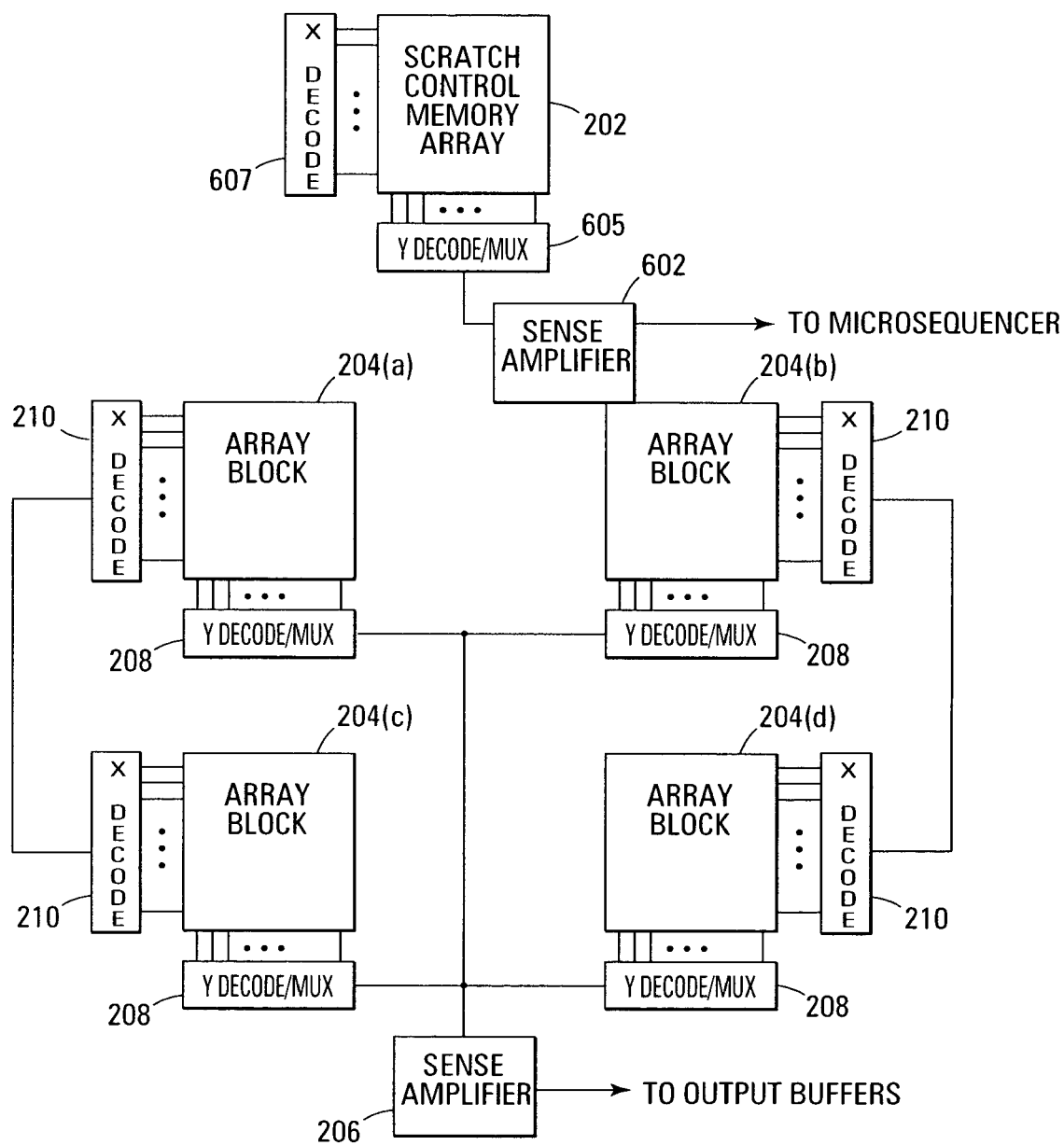
FIG. 6 shows a block diagram of yet another embodiment of the scratch control memory array of the present invention.

FIG. 6 illustrates yet another alternate embodiment of the scratch control memory array of the present invention. In this embodiment, a first sense amplifier 206 is used for the primary memory array 204(a–d) and a second sense amplifier 602 is used for the scratch control memory array 202. The second sense amplifier 602 is coupled to the microsequencer or other control circuit so that the instructions stored in the scratch control memory array 202 can be executed.

Also in the embodiment of FIG. 6, the scratch control memory array 202 uses separate X and Y decoder circuitry 605 and 607 respectively. This enables the microsequencer to access the scratch control memory array 202 separately from the primary array 204(a–d).

CONCLUSION

The scratch control memory array of the present invention provides the memory device manufacturer with the capability of storing complex test and reliability sequences in a separate memory area that is accessible by test technicians. Any desired test algorithm sequence can be stored in the memory and initiated by the technician. This enables the memory devices to be tested in parallel during the manufacturing process, thus greatly decreasing the total test time required for the memory devices. Additionally, unlike the prior art that used hard coded instructions for the controller circuit, the test algorithm sequence of the present invention can be updated in the non-volatile scratch control memory array.

The embodiments of the present invention are not limited to any one type of memory technology. For example, the scratch control memory array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device comprising:
   a controller circuit for executing instructions and generating control signals;
   at least one array block of non-volatile memory; and
   a scratch control array of non-volatile memory cells, separate from and having a quantity of cells that is different than the at least one array block of non-volatile memory, to store the instructions for execution by the controller circuit, the instructions forming a test sequence executed by the controller circuit when a quantity of defective cells of the at least one array block exceeds a predetermined threshold of defective cells.

2. The flash memory device of claim 1 wherein the controller circuit is a microsequencer.

3. The flash memory device of claim 1 wherein the scratch control array additionally stores a result of the execution of instructions.

4. The flash memory device of claim 2 wherein the instruction, together comprise a test sequence executed by the microsequencer on the at least one array block of non-volatile memory cells.

5. The flash memory device of claim 2 wherein the instructions together comprise a memory cell stress sequence that is executed by the microsequencer on the at least one array block of non-volatile memory cells.

6. The flash memory device of claim 1 wherein the scratch control array has a quantity of cells that is less than the at least one array block of memory quantity of cells.

7. The flash memory device of claim 1 wherein execution of the stored instructions is initiated by a signal external to the flash memory device.

8. The flash memory device of claim 1 wherein the device uses NAND architecture.

9. The flash memory device of claim 1 wherein the device uses NOR architecture.

10. A flash memory device comprising:
    a plurality of array blocks of memory;
    a scratch control array of non-volatile memory cells, separate from and having a quantity of cells that is different than each of the plurality of array blocks of memory, that stores instructions for execution; and
    a microsequencer, coupled to the scratch control array, for generating memory control signals in response to execution of the instructions, the microsequencer executing the stored instructions in response to a quantity of defective cells of the plurality of array blocks exceeding a predetermined threshold of defective cells.

11. The flash memory device of claim 10 and further including a sense amplifier coupled to the plurality of array blocks and the scratch control array.

12. The flash memory device of claim 10 wherein the memory control signals include program commands to the plurality of array blocks.

13. The flash memory device of claim 10 wherein the memory control signals include read commands to the plurality of array blocks.

14. A flash memory device comprising:
    a plurality of array blocks of memory;
    a scratch control array of non-volatile memory cells, separate from and having a quantity of cells that is different than each of the plurality of array blocks of memory, that stores rest instructions for execution;

a microsequencer, coupled to the scratch control array, for generating memory control signals in response to execution of the test instructions, the test instructions forming a test sequence executed by the microsequencer when a quantity of defective cells of the plurality of array blocks exceeds a predetermined threshold of defective cells; and test circuitry, coupled to the microsoquencer, for performing test functions on the flash memory device in response to execution of the instructions.

15. The flash memory device of claim 14 and further including:
a first sense amplifier coupled to the plurality of array blocks; and
a second sense amplifier coupled to the scratch control array and the microsequencer.

16. The flash memory device of claim 14 and further including:
a first row decoder coupled to the plurality of array blocks;
a first column decoder coupled to the plurality of array blocks;
a second row decoder coupled to the scratch control array, and
a second column decoder coupled to the scratch control array.

17. A method for implementing a scratch control non-volatile memory array having a quantity of cells that is less than any memory blocks of non-volatile memory cells in a flash memory device, the method comprising:
accessing the scratch control non-volatile memory array to retrieve a plurality of test instructions in response to a quantity of defective cells of the memory blocks exceeding a predetermined threshold of defective cells, the scratch control non-volatile memory array comprising a quantity of non-volatile memory cells that are separate from and the quantity being less than any memory block of the flash memory device;
a microsequencer executing the plurality of teat instructions in response to the quantity of defective cells of the memory blocks exceeding the predetermined threshold of defective cells; and
generating a memory device control signal in response to the execution of the plurality of test instructions.

18. The method of claim 17 and further including storing results of the execution of the instruction.

19. The method of claim 17 and further including updating the plurality of instructions in response to the execution.

20. A method for implementing a scratch control non-volatile memory array having a quantity of cells that is less than any memory blocks of non-volatile memory cells in a flash memory device, the method comprising:
storing a plurality of memory device test instructions in the scratch control non-volatile memory array, the test instructions representing a test algorithm sequence, the scratch control non-volatile memory array comprising a quantity of non-volatile memory cells that are separate from and the quantity being less than any memory block of the flash memory device;
initiating execution of the test algorithm sequence in response to a quantity of defective memory cells of the memory blocks exceeding a predetermined threshold of defective cells;
accessing the scratch control memory array to retrieve each instruction of the plurality of memory device test instructions;
executing each of the plurality of memory device test instructions;
generating a memory device control signal in response to the execution of the plurality of memory device test instructions; and
storing results of the test algorithm sequence in the scratch control memory array.

21. A memory system comprising:
a processor that controls operation of the memory system; and
a flash memory device comprising:
a controller circuit for executing instructions and generating control signals;
at least one array block of non-volatile memory; and
a scratch control array of non-volatile memory cells, separate from and having a quantity of cells that is different than each of the at least one array block of non-volatile memory, to store the instructions for execution by the controller circuit, the instructions forming a test sequence executed by the controller circuit when a quantity of defective cells of the at least one array block exceeds a predetermined threshold of defective cells.

22. The memory system of claim 20 and further including:
a first sense amplifier coupled to the at least one array block;
a first row decoder coupled to the at bait one array block; and
a first column decoder coupled to the at least one array block.

23. The memory system of claim 21 and further including:
a second sense amplifier coupled to the scratch control array;
a second row decoder coupled to the scratch control array; and
a second column decoder coupled to the scratch control array.

* * * * *

UNITED STATES PATENT AND TRADEMARK OFFICE
CERTIFICATE OF CORRECTION

| | | |
|---|---|---|
| PATENT NO. | : 7,069,377 B2 | Page 1 of 1 |
| APPLICATION NO. | : 10/431766 | |
| DATED | : June 27, 2006 | |
| INVENTOR(S) | : Frankie F. Roohparvar | |

It is certified that error appears in the above-identified patent and that said Letters Patent is hereby corrected as shown below:

Column 7, Line 39, Claim 17 replace "teat" with --test--

Signed and Sealed this

Seventh Day of November, 2006

JON W. DUDAS
*Director of the United States Patent and Trademark Office*